(12) United States Patent
Hagino

(10) Patent No.: US 7,711,128 B2
(45) Date of Patent: May 4, 2010

(54) SYSTEM, CIRCUIT, AND AMPLIFIER FOR REDUCING POP SOUND

(75) Inventor: Kohichi Hagino, Hyougo-ken (JP)

(73) Assignee: Ricoh Company, Ltd., Tokyo (JP)

( * ) Notice: Subject to any disclaimer, the term of this patent is extended or adjusted under 35 U.S.C. 154(b) by 1613 days.

(21) Appl. No.: 10/953,435

(22) Filed: Sep. 29, 2004

(65) Prior Publication Data

US 2005/0084120 A1 Apr. 21, 2005

(51) Int. Cl.
*H04B 15/00* (2006.01)
*H03F 3/45* (2006.01)

(52) U.S. Cl. ....................... 381/94.5; 330/69

(58) Field of Classification Search ............... 381/94.5, 381/120, 121; 330/10, 69
See application file for complete search history.

(56) References Cited

U.S. PATENT DOCUMENTS

| | | | |
|---|---|---|---|
| 5,220,613 A * | 6/1993 | Nishioka et al. | 381/104 |
| 7,471,941 B2 * | 12/2008 | Dauphinee et al. | 330/254 |
| 2003/0128489 A1 | 7/2003 | Katoh et al. | |

FOREIGN PATENT DOCUMENTS

| | | |
|---|---|---|
| JP | 4-86109 | 3/1992 |
| JP | 10-261921 | 9/1998 |
| JP | 2001-6357 | 1/2001 |

OTHER PUBLICATIONS

Feb. 26, 2008 Japanese Official Action in connection with corresponding Japanese patent application No. 2003-337509.
English translation of Feb. 26, 2008 Japanese official action in connection with corresponding Japanese patent application No. 2003-337509.

* cited by examiner

*Primary Examiner*—Ping Lee
(74) *Attorney, Agent, or Firm*—Cooper & Dunham LLP

(57) ABSTRACT

An audio power amplifier includes a differential amplifier circuit that serves as an input circuit. The differential amplifier circuit includes a signal GND (SG) terminal that receives a SG voltage, and an audio signal input terminal that receives an audio signal. A SG voltage generation circuit is provided to output the SG voltage. The SG voltage generation circuit includes a voltage follower amplifier that outputs a current, a reference voltage source that is input to the voltage follower amplifier, and a current control circuit that controls the current output from the voltage follower amplifier. The SG voltage rises in a prescribed manner while suppressing a pop sound during its transition.

18 Claims, 9 Drawing Sheets

SYSTEM, CIRCUIT, AND AMPLIFIER FOR REDUCING POP SOUND

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

1. Technical Field

This disclosure relates to audio power amplifiers, systems, constant voltage generation circuits, and amplifier circuits for use in a speaker system, and in particular to such audio power amplifiers, systems, constant voltage generation circuits, and amplifier circuits, which employ a pop sound reduction circuit and reduce so called a pop sound likely generated when a power supply is turned on/off or a standby mode is terminated.

2. Discussion of the Background Art

It is well known that a speaker system sometimes generates a strange shock sound called a pop sound when a power supply is turned on/off or a standby mode is terminated and a voltage increases, i.e., in a transition period, at applicable section of the audio power amplifier circuit. Such a shock sound is not only considerably offensive to the ear and uncomfortable, but also sometimes damages the speaker.

In order to prevent such a pop sound, mute control is conventionally executed to forcibly stop signal transmission in the audio power amplifier during a time period starting from a start time when a power is supplied or a standby mode is terminated to a termination time when a power supply of the amplifier is sufficiently powered up and running. Another conventional approach is to slow down the change in voltage by employing a delay circuit formed from a capacitor and a resistor as shown in FIG. 10.

In other instances, a conventional audio power amplifier circuit does not take any countermeasures against the pop sound, and simply includes a power amplifier AMP1 connected to a differential amplifier circuit provided in an input stage. An audio signal IN is input to an inversion input terminal (i.e., a minus terminal) of the power amplifier AMP1 via a resistor R11. A feedback resistor R12 is connected between the output and the inversion input terminal of the power amplifier AMP1. A gain of the power amplifier AMP1 is determined by a ratio between the resistors R11 and R12. A reference voltage Vs is supplied to a non-inversion input terminal (i.e., a plus terminal) of the power amplifier AMP1 via a voltage follower AMP2. The output voltage SGout of the voltage follower AMP2 is utilized as a signal ground for an audio signal (hereinafter referred to as a signal GND or SG). A capacitor C12 is connected to stabilize the signal GND voltage between a signal GND (SG) terminal and ground.

A speaker is connected to the output terminal of the power amplifier AMP1 via a capacitor C11 that filters out a direct current component. A pop sound is likely generated when a power is supplied or a standby mode is terminated in the audio power amplifier circuit, because the signal GND voltage SGout quickly increases as shown by a dashed line in FIG. 12. A countermeasure can be taken to suppress the pop sound, as shown in FIG. 11. Specifically, the reference voltage Vs of FIG. 10 is replaced with a pair of resistors R13 and R14 and a capacitor C13. Thus, a voltage of a non-inversion input terminal of a voltage follower AMP2 and an output voltage SGout can be modified to slowly increase as shown by a dotted line in FIG. 12. As a result, the pop sound is reduced.

Further, Japanese Laid Open patent Application No. 10-261921 describes still another conventional technology directed to the same goal. Specifically, a power supply can indirectly be controlled to start and stop, by using a standby set signal to suppress a sharp transient change, so as to avoid uncomfortable pop sound while predictably avoiding breakdown such as caused by wiring short or the like.

However, the circuit of FIG. 11 requires a significantly large size capacitor C13 in order to suppress the pop sound to an insignificant level, and the capacitor C13 cannot be integrated on an IC, resulting in external attachment. Thus, when the capacitor C13 is employed in a small instrument such as a mobile phone, a headphone stereo, etc., largeness of the capacitor C13 impedes downsizing.

Further, in order to reduce the pop sound to such a level with the circuit of FIG. 11, it takes a long time (e.g. time elapsing T) from when a power is supplied or a standby mode is terminated to when an instrument becomes operable. On the other hand, if the capacitor C13 is downsized to reduce the time period before the operable condition, the pop sound is insufficiently suppressed, and is offensive to the ear.

Such a sound is now briefly discussed. In general, a sound comfortable to hear has a relatively low frequency, and can be heard if sound waves having different frequencies are superimposed in which one of them is a multiple or a simple integral ratio to the other. For example, a rale located at a center of a fingerboard of piano is generally tuned to approximately 442 Hz while a low rale lower by one octave is tuned to approximately 221 Hz. A high rale, on the other hand, is one octave higher than the rale is tuned to approximately 884 Hz. When those rales are simultaneously hit, a considerably harmonious sound is generated because of superimposition of integral multiple sounds of the lowest rale as a reference.

In contrast, sound offensive to the ear, i.e., uncomfortable sound, can be heard when having a higher frequency. The same occurs when waves of different frequencies are intricately superimposed. For example, when a large number of fingerboards of piano are simultaneously hit at random, a ratio between respective frequencies is generally not a multiple or simple, thereby generating an uncomfortable sound. In this respect, if a sound quality of the pop sound is changed by either lowering a frequency of a sound wave or omitting sound waves having prescribed frequency components, uncomfortable pop sound can be suppressed.

SUMMARY

In an aspect of this disclosure, there is provide a novel audio power amplifier circuit comprising a differential amplifier that serves as an input circuit and includes a signal GND (SG) terminal that receives a SG voltage, and an audio signal input terminal that receives an audio signal. A SG voltage generation circuit is provided to generate and output the SG voltage and includes a voltage follower amplifier that flows a current, a reference voltage source that is input to the voltage follower amplifier, and a current control circuit that controls the current output from the voltage follower amplifier. In a preferred embodiment, the SG voltage rises with a prescribed performance suppressing a pop sound during its transition.

In another embodiment, the SG voltage gently rises, quickly increases at substantially the mid rising point, and gently increases in the vicinity of the reference voltage.

In yet another embodiment, the output current of the voltage follower amplifier decreases when the SG voltage is low, increases as the SG voltage increases, becomes the largest when the SG voltage is approximately the half of the reference voltage, and decreases as the SG voltage approaches the reference voltage.

In yet another embodiment, the output current of the voltage follower amplifier decreases when the signal ground voltage is low, increases as the signal ground voltage increases, becomes the largest when the signal ground voltage is approximately the half of the reference voltage, and decreases as the signal ground voltage approaches the reference voltage.

In yet another embodiment, the current control circuit includes an output circuit connected to the voltage follower amplifier, a maximum current generation circuit that generates a maximum current, and an equivalent current flowing device that causes the voltage follower amplifier to output a current equivalent to the maximum current.

In yet another embodiment, the maximum current generation circuit includes a first MOSFET connected to a first current source, through its source, and to the output terminal of the SG voltage generation circuit, through its gate. A second MOSFET is mutually connected with the first MOSFET, through their sources, and to a first midpoint voltage between zero volts and the reference voltage, through its gate. A third MOSFET is connected to the second current source, through its source, and to the output terminal of the SG voltage generation circuit, through its gate. A fourth MOSFET is mutually connected with the third MOSFET, through their sources, and to a second midpoint voltage between the first midpoint voltage and the reference voltage, through its gate. In a preferred embodiment, the maximum output current is the sum of a first difference between drain currents of the first and second MOSFETs, and a second difference between drain currents of the third and fourth MOSFETs.

In yet another embodiment, the maximum current generation circuit includes a sample hold circuit that holds a voltage appearing immediately before the SG voltage starts rising, and a first MOSFET connected to a first current source, through its source, and to an output terminal of the SG voltage generation circuit, though its gate. A second MOSFET is mutually connected with the first MOSFET, through their sources, and to a midpoint voltage between the SG voltage held in the sample hold circuit and the reference voltage, through its gate. A third MOSFET is connected to the second current source, through its source, and to an output terminal of the SG voltage generation circuit, though its gate. A fourth MOSFET mutually is connected with the third MOSFET, through their sources, and to the second midpoint voltage between the first midpoint voltage and the reference voltage.

In yet another embodiment, the maximum current generation circuit includes a sample hold circuit that holds a voltage appearing immediately before the signal ground voltage starts rising, and a first MOSFET connected to a first current source, through its source, and to an output terminal of the signal ground voltage generation circuit, though its gate. A second MOSFET is mutually connected with the first MOSFET, through their sources, and to a midpoint voltage between the signal ground voltage held in the sample hold circuit and the reference voltage, through its gate. A third MOSFET is connected to the second current source, through its source, and to an output terminal of the signal ground voltage generation circuit, though its gate. A fourth MOSFET mutually is connected with the third MOSFET, through their sources, and to the second midpoint voltage between the first midpoint voltage and the reference voltage.

In yet another embodiment, a constant voltage generation circuit converts an input voltage to a prescribed output voltage, and includes a voltage output circuit that outputs a constant voltage, a maximum current generation circuit that generates a prescribed current as large as the constant voltage generation circuit can output, and an equivalent current flowing device that causes the voltage output circuit to flow a maximum current equivalent to the prescribed current generated by the maximum current generation circuit.

In yet another the maximum current generation circuit includes a plurality of current sources, and a calculation device that applies addition and subtraction to an optional combination of currents output from the at least two current sources in accordance with a constant voltage output when the constant voltage starts rising. In a preferred embodiment, the calculation device sets the addition and subtraction result as the maximum current.

BRIEF DESCRIPTION OF DRAWINGS

A more complete appreciation of the present disclosure and many of the attendant advantages thereof will be readily obtained as the same becomes better understood by the following detailed description when considered in connection with the accompanying drawings, wherein.

DESCRIPTION OF THE PREFERRED EMBODIMENTS

Figure 1:
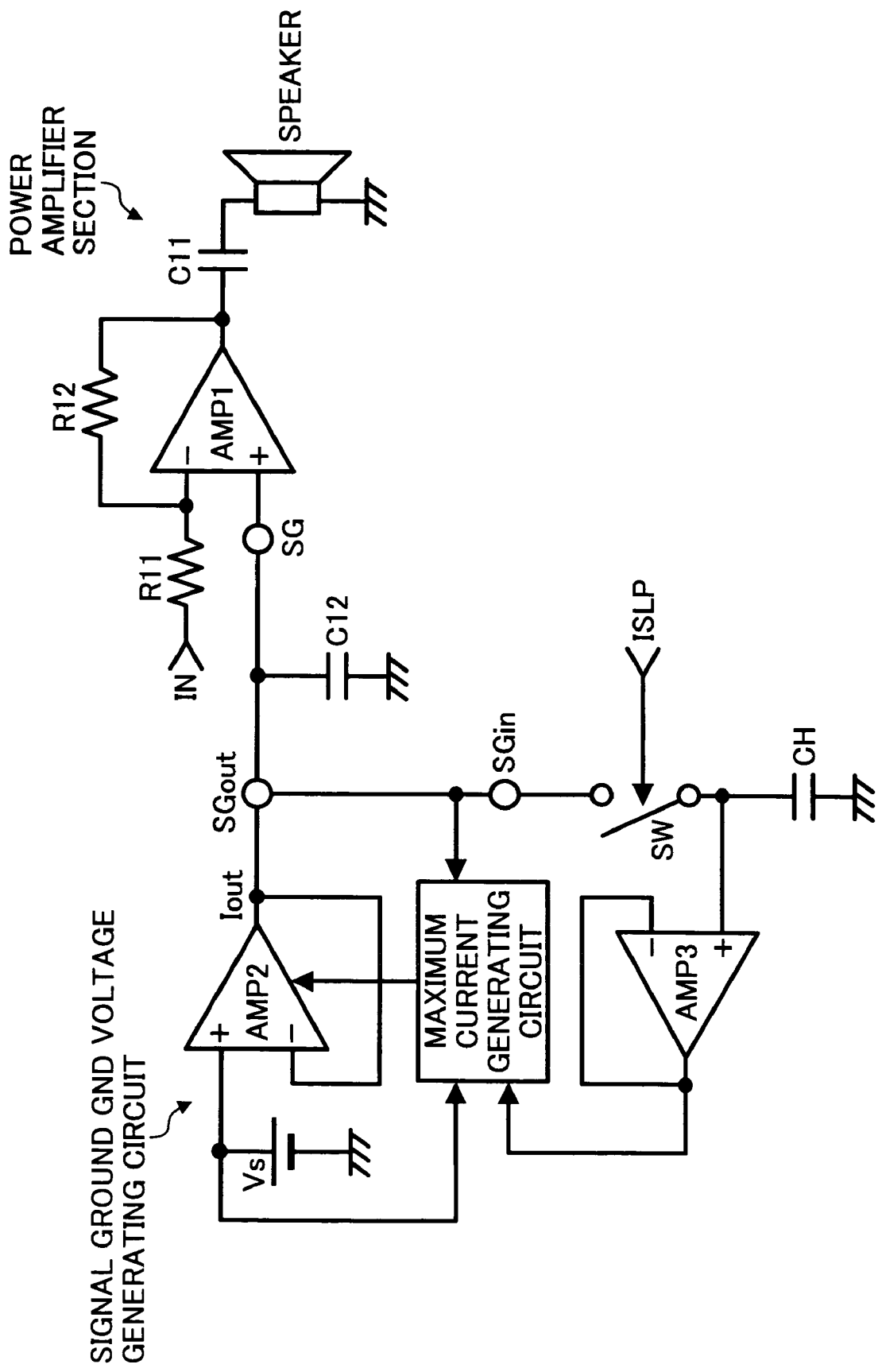
FIG. 1 illustrates a pop sound reduction circuit according to one exemplary embodiment of the present application.

Referring now to the drawings, wherein like reference numerals designate identical or corresponding parts throughout several views, and in particular to FIG. 1, a pop sound reduction circuit is described below as an exemplary embodiment of the present application. The pop sound reduction circuit includes, but is not limited to, a power amplifier section formed from a power amplifier AMP1 serving as a differential amplifier circuit in its input stage, an input resistor R11 and a feedback resistor 12 which collectively determine a gain, a capacitor C11 that cuts off a direct current, and a speaker. Further included is a signal GND voltage generation circuit section formed from a reference voltage Vs, a voltage follower AMP2, and a maximum current generation circuit that sets the maximum current that the voltage follower AMP2 can output. The maximum current generation circuit includes a sample hold circuit formed from a switching device SW, a hold capacitor CH, and a voltage follower AMP3. The sample hold circuit holds a voltage appearing right before the signal GND voltage increases. A capacitor C12 is connected between the signal GND (SG) terminal and GND to stabilize a signal GND voltage. A power amplifier section employs a conventional technology and is thus not described.

The signal GND voltage generation circuit will be now described in detail. A switching device SW is turned on when a sleep signal ISLP is in a high level, and is turned off when the sleep signal ISLP is in a low level. Since the sleep signal ISLP is in a high level in a stand by mode, the switching device SW is turned on at the time. Since the voltage follower AMP2 is deactivated (i.e., turned off) in the standby mode, an output voltage is zero volts. Since the hold condenser CH is charged at this voltage, its voltage is zero volts.

When the standby mode is terminated, the sleep signal ISLP becomes a low level and the switching device SW is turned off, thereby the voltage of the hold capacitor CH is held. The voltage of the hold capacitor CH is output from the voltage follower AMP3. The maximum current generation circuit is supplied a reference voltage Vs, a voltage output from the voltage follower AMP3, and a signal GND voltage SGout. The maximum current generation circuit generates substantially the same current to that output from the voltage follower AMP2 as much as possible.

Figure 2:
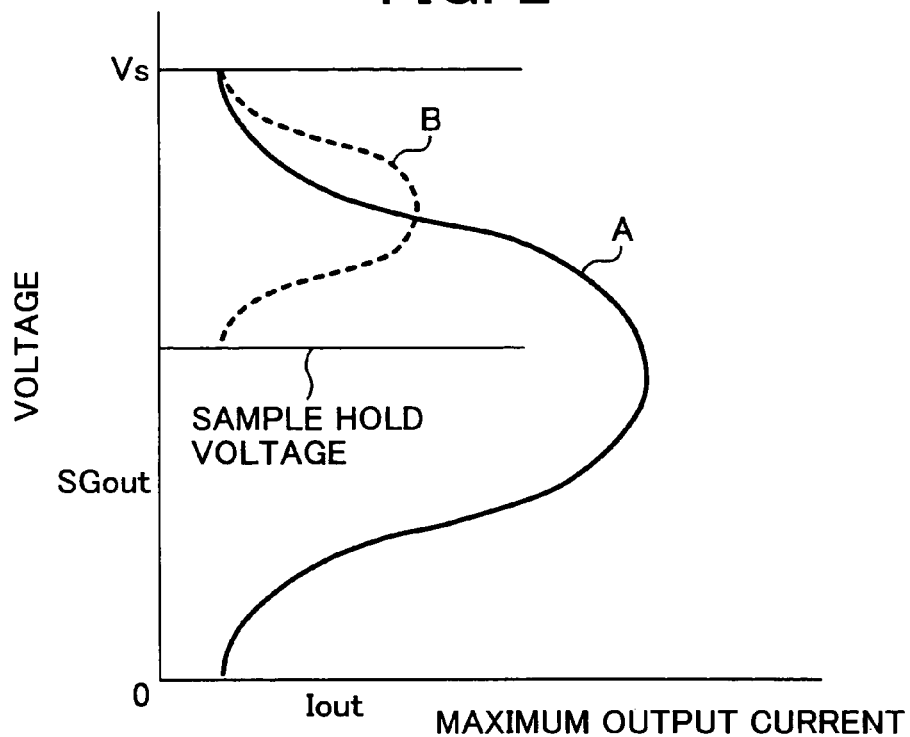
FIG. 2 illustrates a relationship between a signal GND voltage and a current output from a voltage follower AMP2 in the pop sound reduction circuit according to an exemplary embodiment of the present application.

With reference to FIG. 2, a relationship between a signal GND voltage and an output current flowing from the voltage follower AMP2 in a pop sound reduction circuit will be described as an exemplary embodiment of the present application. A curvature shown by a rigid line A represents a relationship between those when a power is supplied, while a curvature shown by a dotted line B represents a relationship therebetween when a standby mode is terminated. As shown, when the signal GND voltage SGout is low, the output current Iout is small, and as the signal GND voltage SGout increases, the output current Iout also increases, and becomes the largest when the signal GND voltage SGout is approximately a half of the reference voltage Vs. When the signal GND voltage SGout further increases toward the reference voltage Vs, the output current Iout decreases, in contrast.

Figure 3:
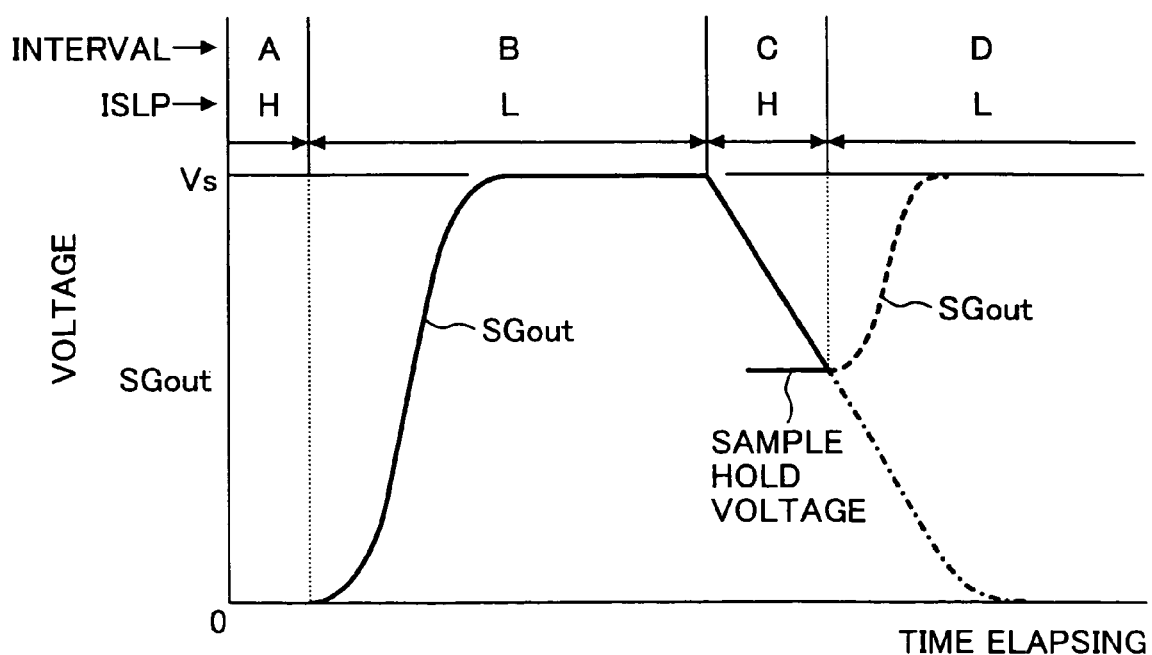
FIG. 3 illustrates transition of the signal GND voltage according to an exemplary embodiment of the present application.

With reference to FIG. 3, transition of the signal GND voltage will now be described. Since the capacitor C12 of FIG. 1 is connected to the output of the voltage follower AMP2, the capacitor C12 is charged by the output. Thus, an increasing speed of the signal GND voltage varies in accordance with a value of the output current of the voltage follower AMP2. Specifically, as shown by an interval B in FIG. 3, the voltage gradually increases due to a low output current at its beginning, and the voltage increases at a higher rate when the output current becomes higher at a middle of the rise. Further, when the voltage approaches the reference Vs, the voltage slowly increases again due to smallness of the output current.

When the standby mode is terminated immediately after being entered thereto, since a sleep signal ISLP changes to a low level as the signal GND voltage drops as shown by an interval C of FIG. 3, the hold capacitor CH holds a presently existing signal GND voltage. Then, the maximum output current generation circuit generates and outputs a current with reference to the voltage held by the hold capacitor CH as shown by a dotted line in FIG. 2. Since the signal GND voltage increases upon receiving the output current, the signal GND voltage increases in a manner (analogous to a rising portion described in an interval B) as shown by a dotted line in an interval D.

Figure 4:
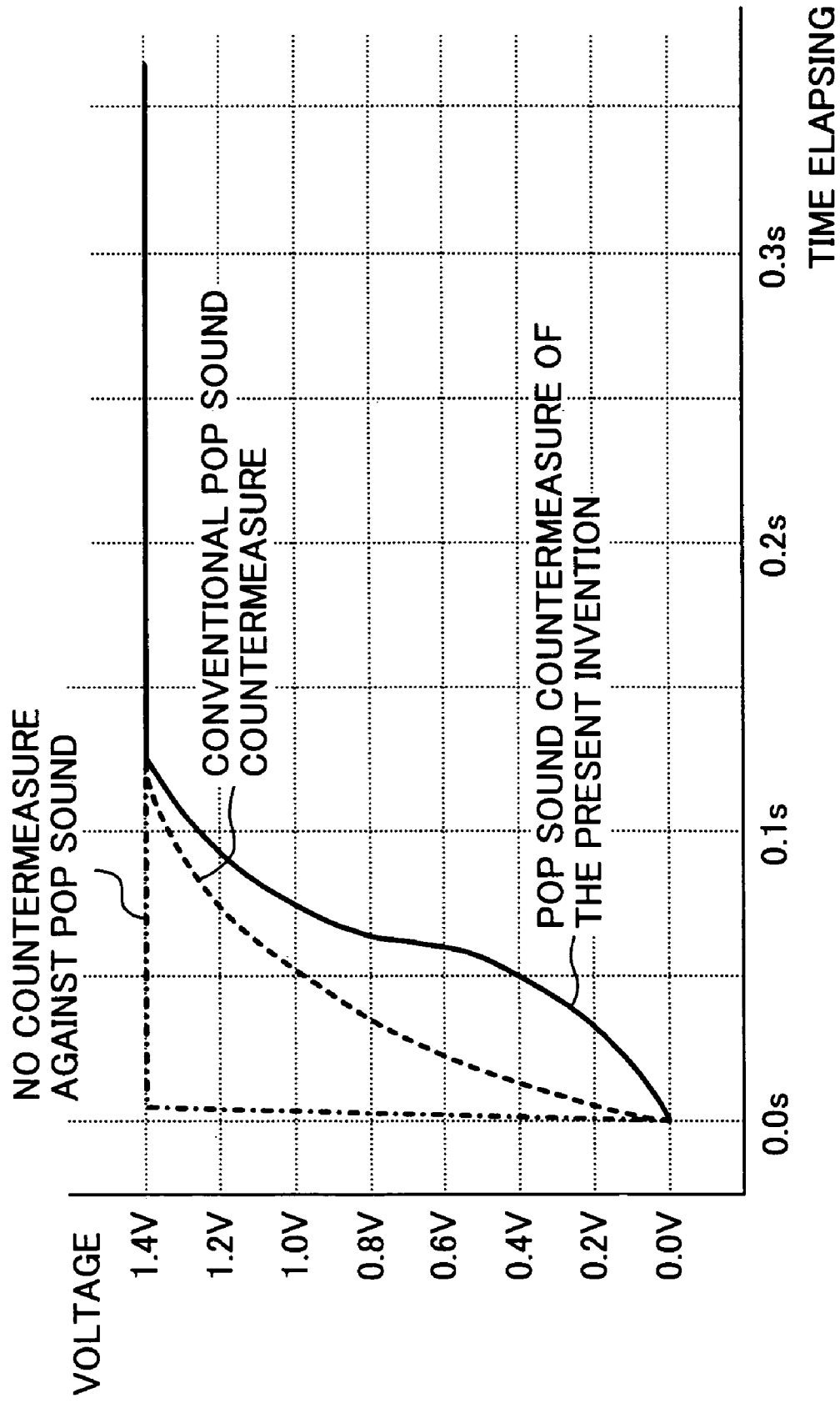
FIG. 4 illustrates transitions of signal GND voltages of a conventional power amplifier and a power amplifier having a pop sound reduction circuit according to an exemplary embodiment of the present application.

With reference to FIG. 4, a relationship between transitions of a signal GND voltage generated in a power amplifier with a pop sound reduction circuit according to an exemplary embodiment of the present application on the one hand and that generated in a conventional power amplifier on the other hand will be described. A solid line represents the transition of a signal GND voltage of a power amplifier having a pop sound countermeasure according to an exemplary embodiment of the present application, while a dotted line represents that of a signal GND voltage of a power amplifier with a conventional pop sound countermeasure. Further, a dashed line represents the transition of a signal GND voltage of a power amplifier without any pop sound countermeasures.

Figure 5A:
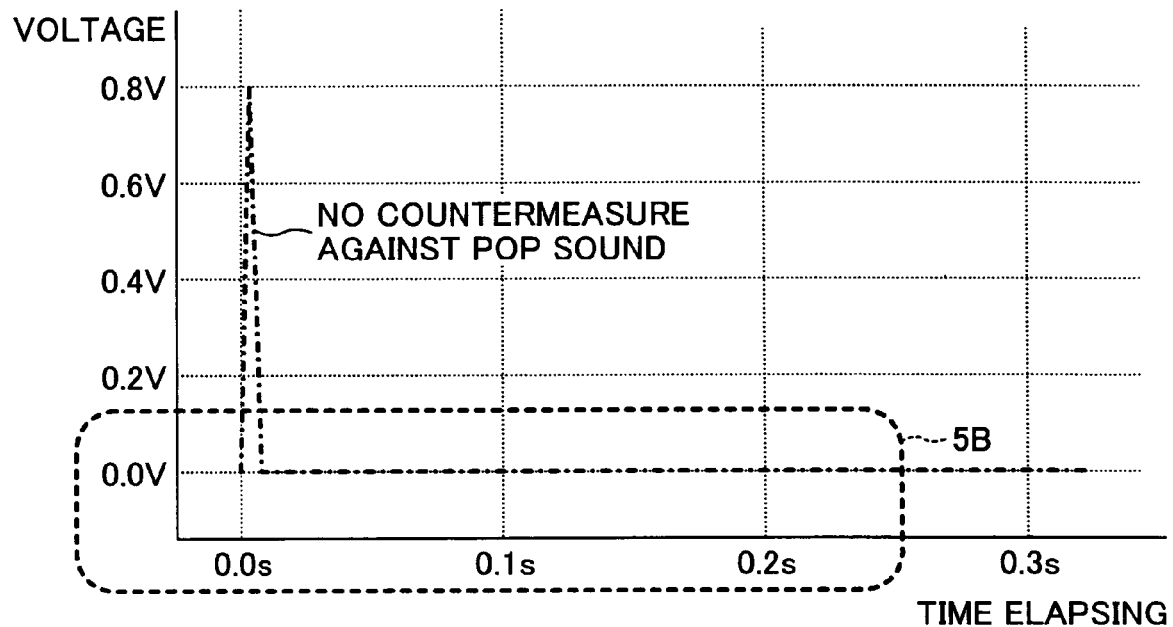
FIGS. 5A and 5B illustrate transitions in a voltage appearing at a speaker input terminal both in a conventional power amplifier and a power amplifier having a pop sound reduction circuit according to an exemplary embodiment of the present application.
Figure 5B:
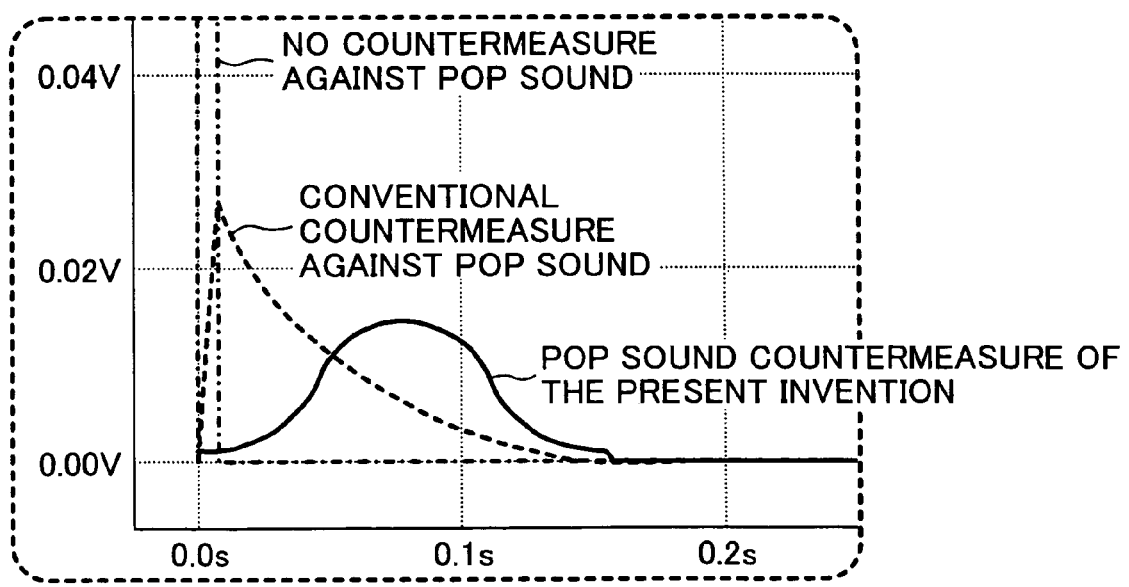

With reference to FIGS. 5A and 5B, a relationship between transitions of a voltage appearing at a speaker input terminal in a power amplifier with a pop sound reduction circuit according to an exemplary embodiment of the present application and that in a conventional power amplifier will be described. A solid line represents transition of a speaker input voltage of the power amplifier with a pop sound countermeasure according to an exemplary embodiment of the present application, while a dotted line represents that of a speaker input voltage of the power amplifier with a conventional pop sound countermeasure. Further, a dashed line represents the transition of a speaker input voltage of a power amplifier without any pop sound countermeasures.

Figure 10:
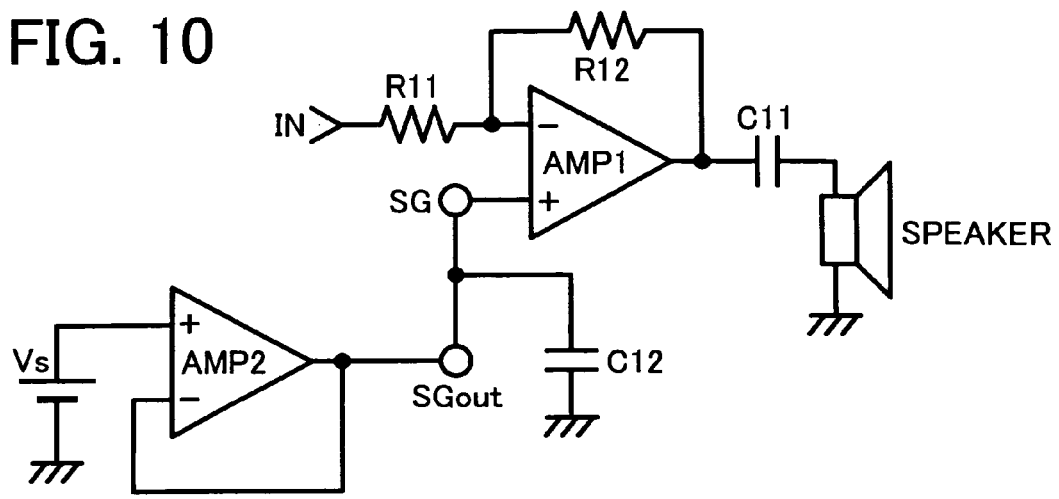
FIG. 10 illustrates a conventional audio power amplifier circuit without any countermeasure against pop sound.
Figure 11:
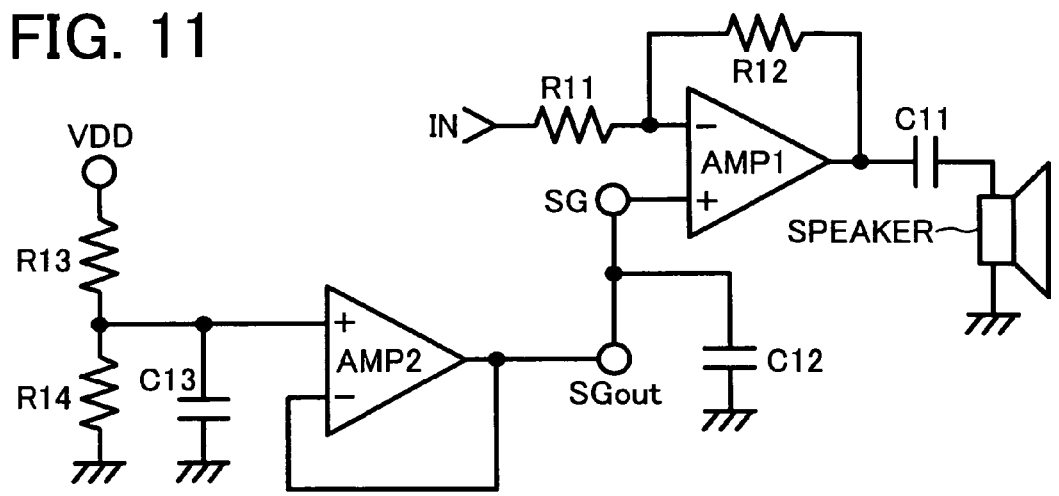
FIG. 11 illustrates a conventional audio power amplifier circuit with a countermeasure against pop sound.
Figure 12:
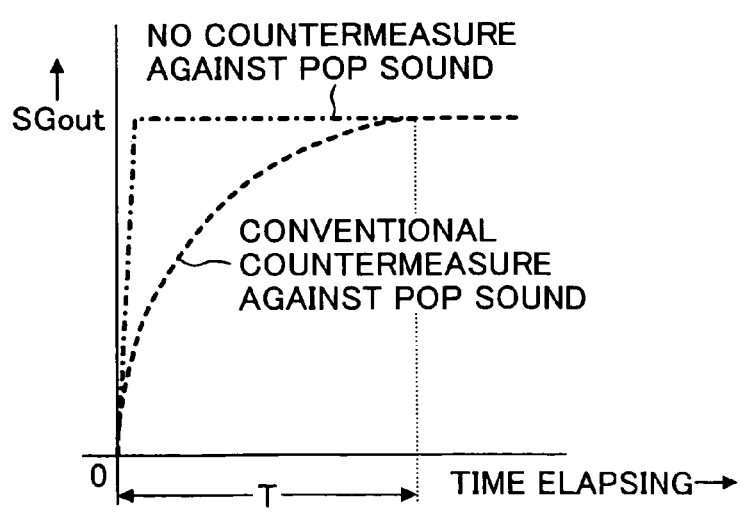
FIG. 12 illustrates transition of a signal GND voltage appearing in conventional audio power amplifier circuits.

In the power amplifier without any pop sound countermeasures shown in FIG. 10, an input voltage to the speaker sharply increases to a considerably high voltage and returns to zero volts in the same manner. The signal GND voltage reaches the reference voltage Vs within a short, period as shown in FIG. 4 when power is supplied. In the power amplifier with the conventional pop sound countermeasure of FIG. 11, an input voltage to the speaker initially increases sharply, gradually returns, and ultimately settles down to zero. That is, the signal GND voltage in the power amplifier of FIG. 11 increases less sharply than that in the power amplifier without any pop sound counter measures when power is supplied, and then gradually reaches the reference voltage Vs as shown in FIG. 4.

In contrast, in the power amplifier with the pop sound countermeasure of the an exemplary embodiment of the present application as shown in FIG. 1, a voltage input to the speaker initially increases gradually, decreases gradually, and is settled down to zero when a prescribed time period has elapsed. That is, the signal GND voltage gradually increases when a power is supplied, increases at an increasing rate until a mid point, then increases at a decreasing rate after the midpoint, and finally reaches the reference voltage Vs gradually as shown in FIG. 4.

Further, as understood from FIGS. 4 to 5B, the speaker input voltage can be obtained by differentiating the signal GND voltage. Specifically, a waveform of the speaker input voltage is a differentiated wave of the signal GND voltage. By applying Fourier transformation to the waveform, a graph can be obtained as shown in FIG. 6.

Figure 6:
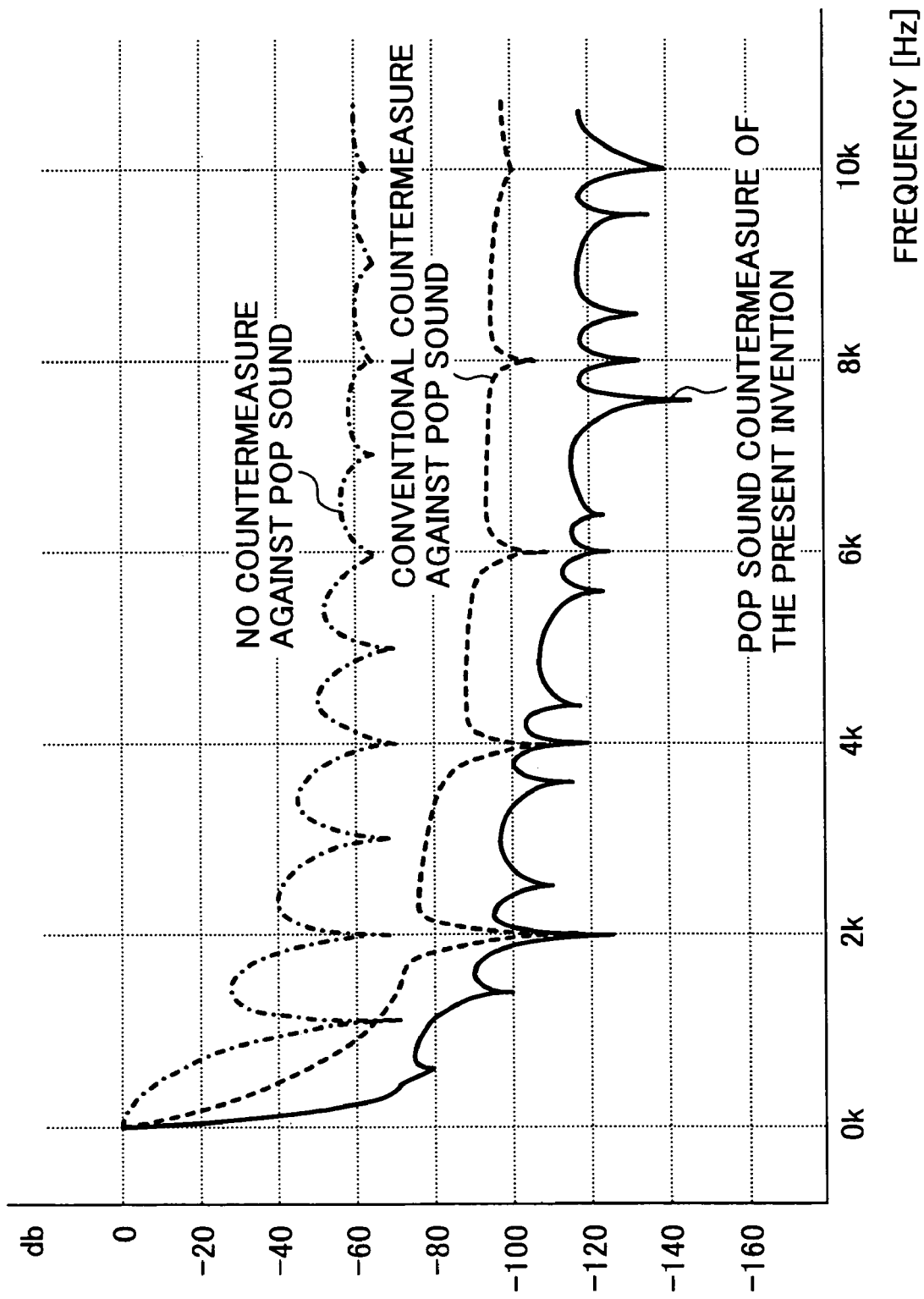
FIG. 6 substantially illustrates a relation between a speaker input voltage and a frequency appearing in each of a conventional power amplifier and a power amplifier having a pop sound reduction circuit according to an exemplary embodiment of the present application.

Referring now to FIG. 6, a relationship between a speaker input voltage and a frequency appearing in each of a power amplifier with a pop sound countermeasure according to an exemplary embodiment of the present application and conventional power amplifiers are described, wherein a unit of a vertical axis is a decibel. As shown, a solid line represents a relationship between speaker input voltage and frequency in the power amplifier with a pop sound countermeasure according to an exemplary embodiment of the present application, a dotted line represents a relationship between speaker input voltage and frequency in the power amplifier with a conventional pop sound countermeasure, and a dashed line represents a relationship between speaker input voltage and frequency in the power amplifier without any pop sound countermeasures. If a voltage of the speaker input terminal corresponds approximately to a sine curve, the energy in a frequency spectrum stands substantially on one frequency in a graph, and thereby a sound generated might not be offensive to the ear. Only a sound having a high frequency might be offensive to the ear.

When comparing the above-mentioned three circuits, the power amplifier without any pop sound countermeasures has a large amplitude, thereby generating a large pop sound. In contrast, the power amplifier with the pop sound countermeasure according to an exemplary embodiment of the present application allows the energy to concentrate on a low frequency in the frequency spectrum, thereby creating smaller intensity in the high frequency side than the power amplifier with the conventional countermeasure and the power amplifier without any pop sound countermeasures. Accordingly, a pop sound may be reduced.

As a result, since a frequency component of a pop sound concentrates on a low frequency side, and a tone approaches a sine curve even during a time period when a standby mode is terminated or power is supplied and the power amplifier circuit becomes operative, a sound that is offensive to the ear which is expected from a conventional power amplifier is suppressed. Further, due to employment of a sample hold circuit (e.g. a hold capacitor CH) holding a signal GND voltage appearing just before cancellation of the standby mode, a pop sound can be improved even if the standby mode is terminated immediately after entering into the mode. In addition, since the externally attached large capacity capacitor C13 is omitted, an instrument can be downsized.

Figure 7:
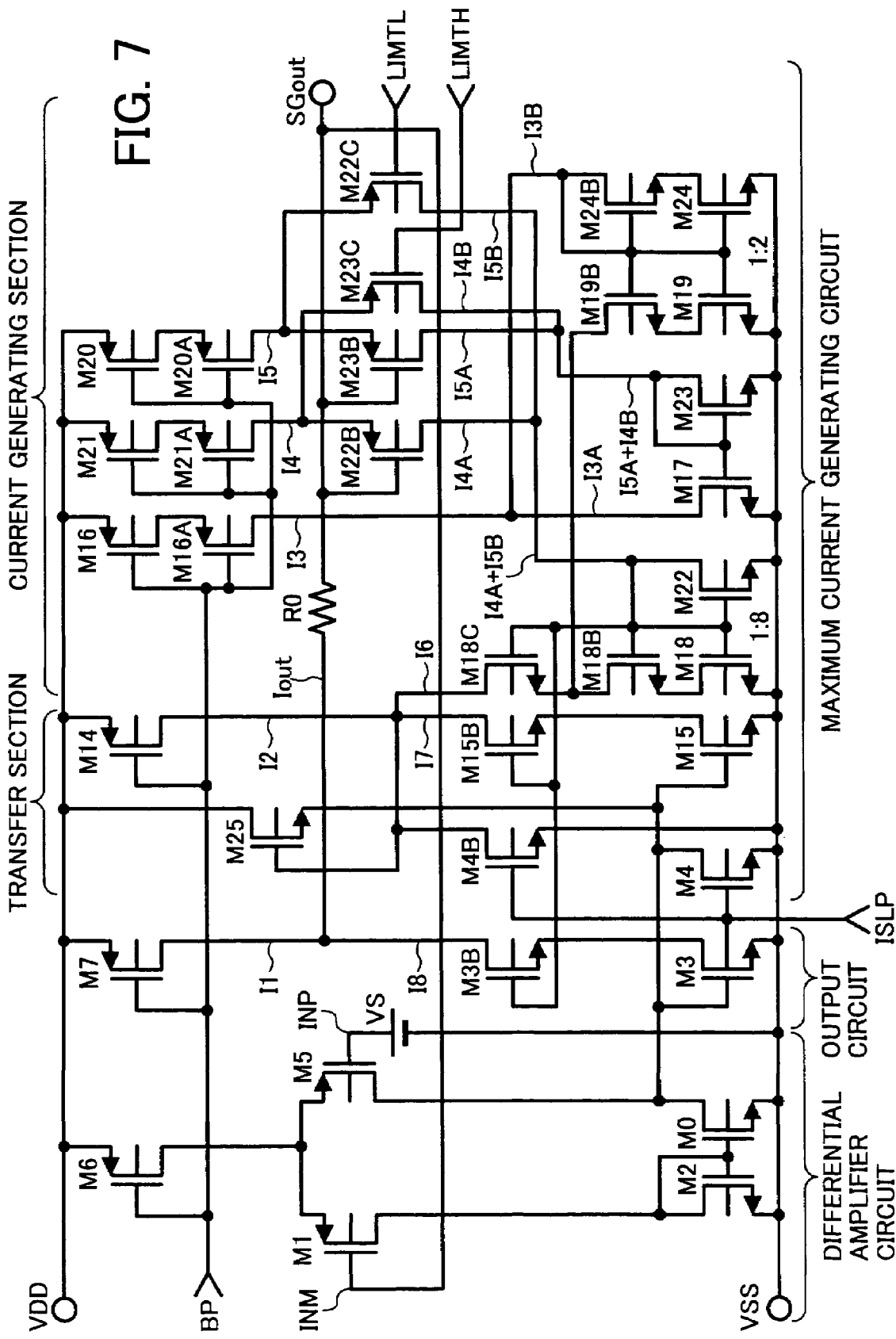
FIG. 7 specifically illustrates an exemplary voltage follower AMP2 and an exemplary maximum current generation circuit provided in the pop sound reduction circuit according to an exemplary embodiment of the present application.
Figure 8:
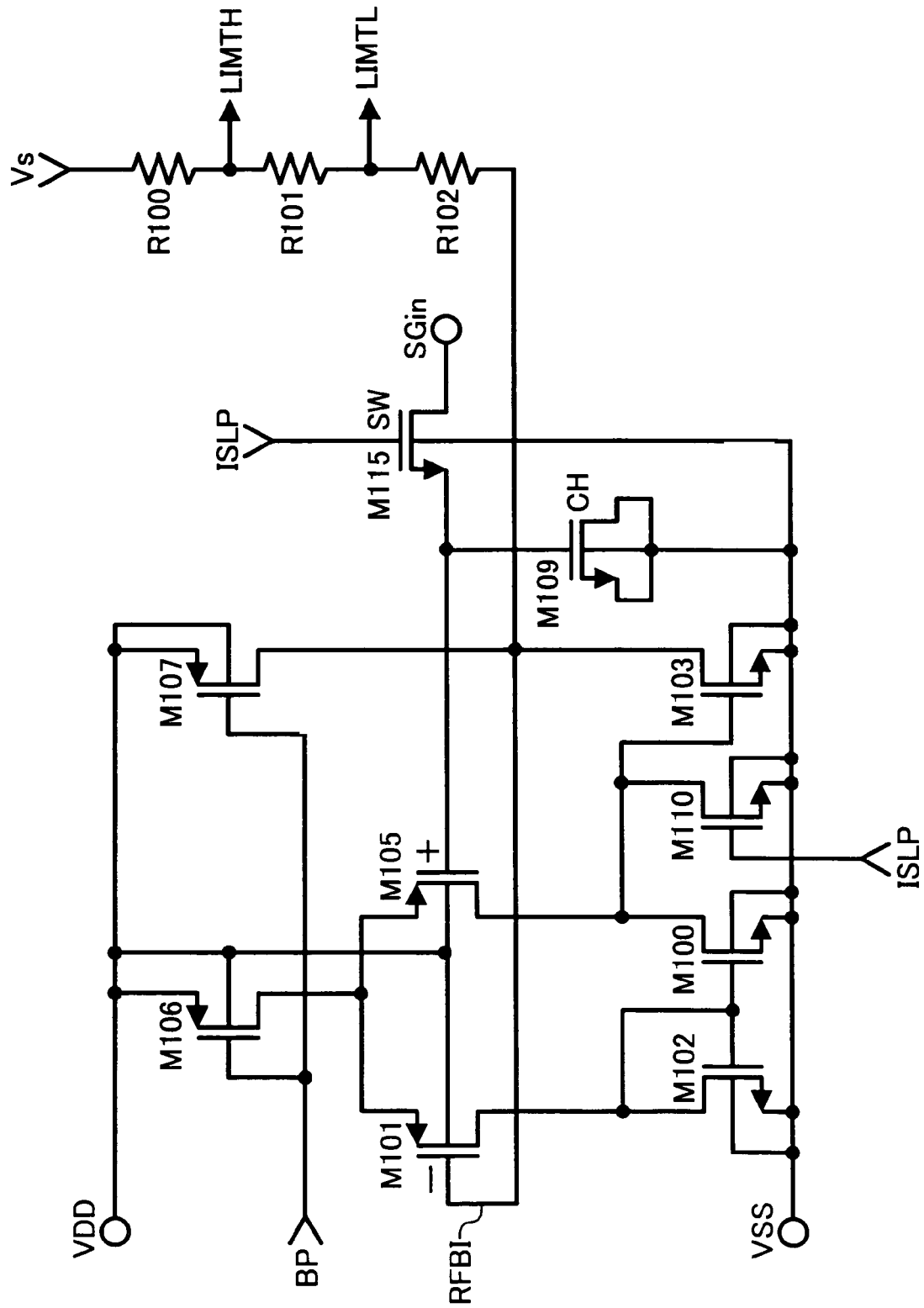
FIG. 8 illustrates an exemplary sample hold circuit provided in the pop sound reduction circuit according to an exemplary embodiment of the present application.

Referring now to FIGS. 7 and 8, a signal GND voltage generation circuit included in a pop sound reduction circuit according to an exemplary embodiment of the present application will be described more in detail. As shown in FIG. 7, a voltage follower AMP2 and a maximum current generation circuit are included in the signal GND voltage generation circuit. The signal GND voltage generation circuit is formed from at least a reference voltage Vs as a power source and an output circuit arranged between a differential amplifier circuit and an output terminal SGout. Wiring of back gates in an MOSFET, however, are omitted.

The reference voltage Vs is connected between a non-inverted input INP of the differential amplifier circuit mentioned later in detail and a negative side voltage Vss of the power supply. The differential amplifier circuit includes at least a plurality of MOSFETs M1, M5, M2, M10, and M6. Such MOSFETs M1 and M5 are P-channel types and form a differential input. The MOSFET M6 of a P-channel type supplies a bias current to the differential amplifier circuit. The MOSFETs M2 and M0 are N-channel types and collectively form a current mirror, while serving as a load for the differential inputs. The output circuit is formed from a P-channel MOSPET (PchMOSFET) M7 and a N-channel MOSFET (NchMOSFET) M3.

The gate of the PchMOSFET M7 is connected to a prescribed bias voltage BP and forms a current source 11. The gate of the NchMOSFET M3 is connected to the drain of the NchMOSFET M0 serving as an output terminal of the differential amplifier circuit. Since respective drains of the PchMOSFET M7 and the NchMOSFET M3 are connected to each other via an NchMOSFET M3B, an amplifier circuit is formed from the gate of the NchMOSFET M3 serving as an input terminal and the drain of the PchMOSFET M7 serving as an output terminal. Further, since the drain of the PchMOSFET M7 is connected to an inversion input terminal INM of the differential amplifier circuit via the resistor RO, the voltage follower AMP2 is coupled with the differential amplifier circuit. An output of the voltage follower AMP2 is output from the output terminal SGout as a signal GND voltage.

The maximum current generation circuit is divided into a current generation section that sets a current value that the voltage follower AMP2 can output as much as possible, and a transfer section that transfers the set current value to the output circuit. The transfer section is formed from at least a plurality of MOSFETs M25, M14, M15, and M15B. Since the MOSFET M14 is a P-channel type and forms a current mirror circuit in cooperation with the PchMOSFET M7, a drain current I2 having the same value as the drain current I1 flowing from the PchMOSFET M7 is generated. A value of a drain current I7 of the NchMOSFET M15 is calculated by subtracting a current I6 generated in the below mentioned current generation section from the drain current I2 of the PchMOSFET M14. Since the gate of the NchMOSFET M15 is connected to the gate of the NchMOSFET M3, the drain currents I7 and I8 of the respective NchMOSFETs M15 and M3 are substantially the same. Within the drain currents I1 of the PchMOSFET M7, a current Iout output from the signal GND terminal (SGout) is calculated by subtracting a drain current I8 of the NchMOSFET M3 from the drain current I1. Thus, since the drain currents 18 and 17 are substantially the same, relative to each other, the output current Iout that the signal GND terminal can output as far as possible is substantially the same as the current I6 generated in the maximum current generation circuit.

Further, the gate of the NchMOSFET M15 is connected to a source of the NchMOSFET M25. Since the gate of the NchMOSFET M25 is connected, via the NchMOSFET M15B, to the drain of the NchMOSFET M15 that is connected to the power supply VDD, the NchMOSFET M25 controls a gate voltage of the NchMOSFET M15 after the output current of the voltage follower AMP2 reaches the maximum value. The NchMOSFETs M3B and M15B are provided to suppress ill influence of channel length modulation possibly occurred in the NchMOSFETs M3 and M15.

The current generation section is formed from a plurality of MOSFETs M16 to M24. The respective PchMOSFETs M16, M21, and M20 are P-channel types and form constant current sources 13, 14, and 15 with their gates being connected to a prescribed bias voltage BP. The PchMOSFETs M16A, M21A, and M20A are also provided to suppress ill influence of channel length modulation. PchMOSFETs M23B and M22C serve as first and fourth MOSTETS split a drain current I5 of the PchMOSFET M20 serving as a constant current source. The sources of the PchMOSFETs M23B and M22C are mutually connected and are further connected to the drain of the PchMOSFET M20A. The gate of the PchMOSFET M23B is connected to the output terminal SGout of the signal GND, while the gate of the PchMOSFET M22C is connected to a first midpoint voltage shown in FIG. 8 via a terminal LIMTL.

Referring now to FIG. 8, a sample hold circuit employed in a pop sound reduction circuit according to an exemplary embodiment of the present application will be described. A switching device SW is formed from an NchMOSFET M115 and receives a sleep signal ISLP through its gate. The drain of the NchMOSFET M115 is connected to the output SGout of the voltage follower AMP2 via a terminal SGin. The source of NchMOSFET M115 is connected to a gate of the PchMOSFET M105, which forms a non-inversion input of the voltage follower AMP3. A hold capacitor CH is formed from an NchMOSFET M109 and uses capacitances formed between its gate and source and its gate and drain. The source and the drain of the NchMOSFET M109 are connected to each other and are further connected to the negative side voltage VSS of the power supply. The gate of the NchMOSFET M109 is connected to the source of the NchMOSFET M115.

Further, the voltage follower AMP3 is formed from a differential amplifier circuit and an output amplifier circuit. The differential amplifier circuit is formed from a plurality of MOSFETs M100, M102, M101, M105, and M106. The MOSFETs M101 and M105 are P-channel types and form a differential input. The MOSFET M106 is a P-channel type and supplies a bias current to the differential amplifier circuit. The MOSFETs M102 and M100 are N-channel types and collectively form a current mirror while serving as a load for the differential inputs. The output amplifier circuit is formed from MOSFETs M107 and M103. An output of the differential amplifier circuit is derived from the drain of the NchMOSFET M100 and is supplied to the gate of the NchMOSFET M103. A PchMOSFET M107 is provided to serve as a constant current load for the NchMOSFET M103. The output of the output amplifier circuit is derived from the drain of the MOSFET M103.

The drain of the MOSFET M103 is connected to the gate of the MOSFET M101 serving as an inversion input terminal, thereby forming the voltage follower AMP3. Further, a serial circuit formed from three resistances R100, R101, and R102, is connected between the output of the output amplifier circuit and the reference voltage Vs. A first midpoint voltage LIMTL having a middle voltage between an output voltage of the voltage follower AMP3 and the reference voltage Vs is output from a node between the resistances R102 and 101. A second midpoint voltage LIMTH having a midpoint voltage between the first midpoint voltage LIMTL and the reference voltage Vs is output from a node between the resistances R101 and 100. These two voltages are connected to terminals LIMTH and LIMTL of FIG. 7, respectively.

A sleep signal ISLP is given to the gate of the NchMOSFET M110 that controls an operation of the voltage follower. The drain is connected to the gate of the NchMOSFET M103, while the source is connected to the voltage VSS. Due to turning on when the sleep signal ISLP is in a high level, the gate voltage of the NchMOSFET M103 is set to be zero volts in a standby mode, and the NchMOSFET M103 is turned off, so that the voltage follower stops operating. Further, since the NchMOSFET M115 is turned on in the standby mode as mentioned above, the hold capacitor CH is charged by the signal GND voltage. However, since the signal GND voltage is zero volts in the standby mode, an output voltage of the sample hold circuit holds zero volts when the standby mode is terminated.

Figure 9:
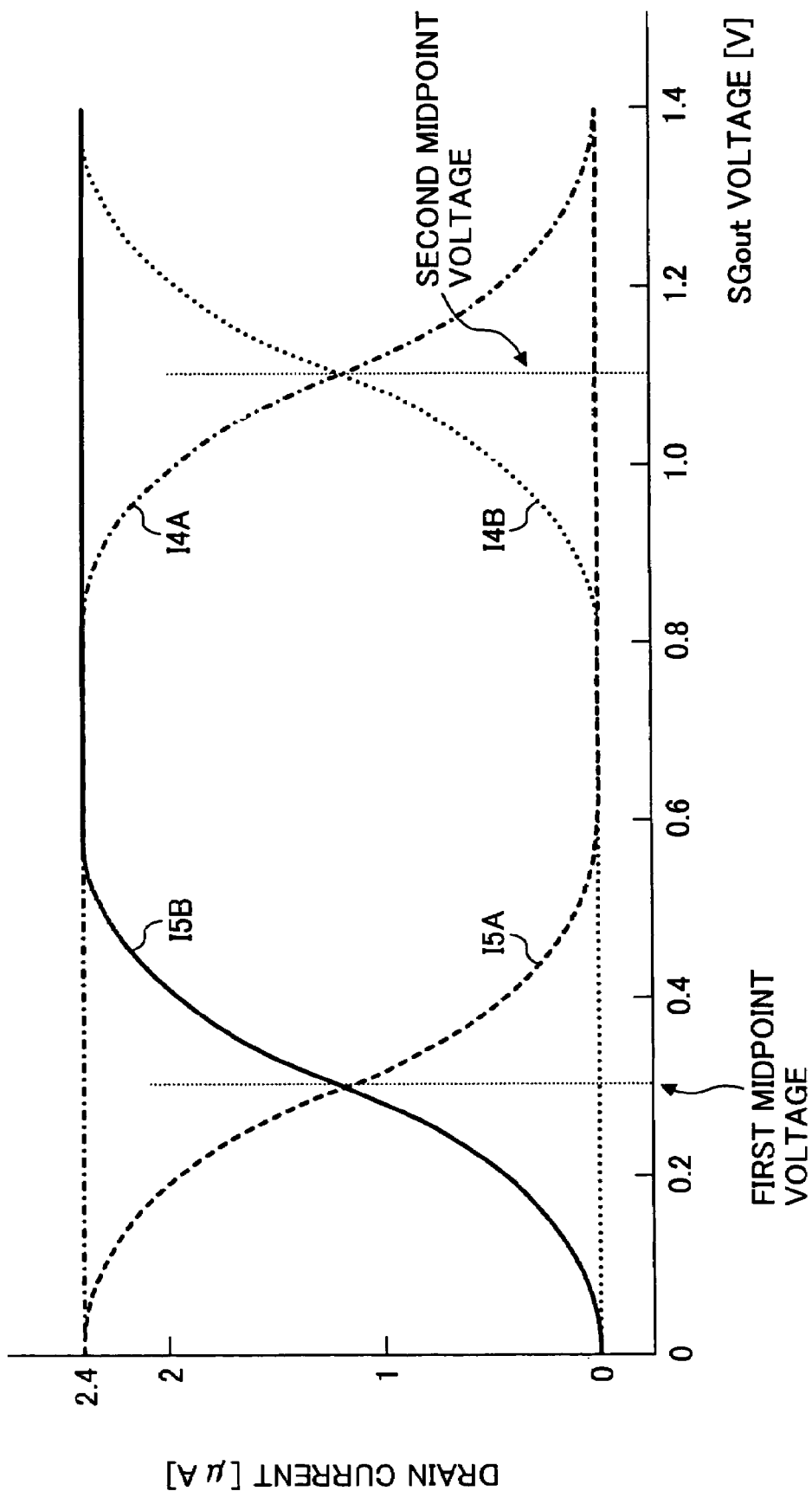
FIG. 9 illustrates a relationship between a signal GND voltage and a drain current appearing in the pop sound reduction circuit according to an exemplary embodiment of the present application.

A relationship between a signal GND voltage and drain currents appearing in a current generation circuit included in a pop sound reduction circuit according to an exemplary embodiment of the present application will be described with reference to FIG. 9. Initially, relationships between drain currents I5A and I5B of PchMOSFETs M23B (serving as a third MOSFET) and M22C, and a signal GND voltage SGout appearing at the time of rise are described. A dotted line represents the drain current I5A, while a solid line represents the drain current I5B. In this preferred embodiment, constant current sources I3 to I5 are each 2.4 micro Amperes.

When the signal GND voltage SGout is sufficiently lower than the first midpoint voltage, the drain current I5 of a PchMOSFET M20 entirely flows into a PchMOSFET M23B, because only the PchMOSFET M23B is turned on. The current I5A is supplied to the drain of the NchMOSFET M23. As the signal GND voltage SGout approaches the first midpoint voltage, a drain current I5B of a PchMOSFET M22C starts flowing while the drain current I5A of the PchMOSFET M23B correspondingly decreases by the amount. When the signal GND voltage SGout arrives at the first midpoint voltage, the drain currents I5A and I5B become substantially the same, relative to each other.

Further, when the signal GND voltage SGout increases, the drain current I5B also increases. When the drain current I5B reaches 2.4 micro Amperes, the drain current I5A drops down to zero Amperes. The drain current I5B is supplied to the drain of the NchMOSFET M22. Similarly, the PchMOSFETs M22B and M23C split a drain current I4 of a PchMOSFET M21 serving as a constant current source. The sources of the PchMOSFETs M22B and M23C serving as a second MOSFET are mutually connected, and are further connected to the drain of the PchMOSFET M21A. The gate of the PchMOSFET M22B is connected to the output terminal SGout of the signal GND, while the gate of the PchMOSFET M23C is connected, via the terminal LIMTH, to the second midpoint voltage.

Now, respective relationships between each of the drain currents I4A and I4B and the signal GND voltage appearing at the time of rise are described with reference to FIG. 9 again. As shown, a dashed line represents a drain current I4A of a PchMOSFET M22B, while a dotted line represents a drain current I4B of a PchMOSFET M23C. When the signal GND voltage SGout is sufficiently lower than the second midpoint voltage, the drain current I4 of a PchMOSFET M21 flows entirely into the PchMOSFET M22B, because only the PchMOSFET M22B is turned on. The current I4A is supplied to the drain of the NchMOSFET M22. As the signal GND voltage SGout approaches the second midpoint voltage, the drain current I4B starts flowing while the drain current I4A correspondingly decreases by the same amount. When the signal GND voltage SGout arrives at the second midpoint voltage, the drain currents I4A and I4B become substantially the same, relative to each other.

When the signal GND voltage SGout further increases, the drain current I4B also increases. When the drain current I4B reaches 2.4 micro Amperes, the drain current I4A drops down to zero Amperes. The drain current I4B is supplied to the drain of the NchMOSFET M23. The drain current I3 is supplied to the respective drains of NchMOSFETs M17 and M24. Since the NchMOSFETs M17 and M23 collectively form a current mirror that outputs currents at the same ratio, i.e., 1 versus 1, the drain current I3A has a value substantially equivalent to the sum of the drain currents I5A and I4B, and a value of a drain current I3B of an NchMOSFET M24 can be calculated by subtracting the sum of the drain currents 15a and 14B from the drain current 13. NchMOSFETs M18, M18B, and M22 collectively form a current mirror that outputs currents at a rate of one versus eight, that is, a drain current of the NchMOSFET M18 is an eighth part of the sum of the drain currents 14A and 15B.

Further, NchMOSFETs M19, M19B, M24, and M24B collectively form a current mirror that outputs currents at a ratio of one versus two. A drain current of the NchMOSFET M19 is a half value of the drain current I3B (e.g. I3−I5A−I4B) of the NchMOSFET M24. Since the drain of the NchMOSFET M19B is connected to a drain of the NchMOSFET M18B, a current I6 generated in the maximum current generation circuit is calculated by the following first and second formulas:

$$I6=(I4A+I5B)/8+I3B/2$$

$$I3B=I3-I3A=I3-I5A-I4B$$

When substituting the second formula into the first formula, the following third formula is obtained:

$$I6=(I4A+I5B)/8+(I3-I5A-I4B)/2$$

The NchMOSFETs M18C, M18B, M19B, and M24B are provided to suppress ill influence of channel length modulation. The NchMOSFETs M4 and M4B control the signal GND voltage generation circuit to stop operating in a standby mode. Specifically, a sleep signal ISLP is supplied to the gate of the NchMOSFET M4. Further, when the sleep signal ISLP becomes high, gates voltages of the NchMOSFETs M3 and M15 become zero, thereby turning off the NchMOSFETs M3 and M15, because the drain of the NchMOSFETs M4 is connected to the gates of the NchMOSFETs M3 and M15. When the sleep signal ISLP becomes high and is supplied to the gate of the NchMOSFET M4B, the gate voltage of the NchMOSFET M25 becomes zero, thereby turning off the NchMOSFET M25, because the drain of NchMOSFET M4B is connected to the gate of the NchMOSFET M25. Further, since the bias voltage BP shorts the power supply VDD, the signal GND voltage generation circuit stops operating when the sleep signal ISLP generated by a circuit (not shown) becomes high.

As mentioned heretofore, the current mirror ratio between a pair of the NchMOSFETs M18 and M18B and the NchMOSFET M22 is one versus eight, while that between a pair of the NchMOSFETs M19 and M19B and that of the NchMOSFETs M24 and M24B is one versus two in the maximum current generation circuit. However, if these ratios are changed, a tone of the pop sound can be accordingly changed, because a relationship between the signal GND voltage and the output current is changed in accordance with these ratios.

Further, by changing the above-mentioned voltages LIMTL and LIMTH, the tone can also be changed.

Further, as mentioned earlier, the ratio dividing currents of each of three current sources is changed as the signal GND voltage increases, and the output current is obtained by applying prescribed addition and subtraction to the divided current.

However, a number of the current sources is not limited thereto, and can be freely changed to obtain fine SG voltage rising performance.

Further, the above-mentioned output current setting system can be utilized as a protection circuit for a constant voltage generation circuit to obtain innovated current protection.

Obviously, numerous additional modifications and variations are possible in light of the above teachings. It is therefore to be understood that within the scope of the appended claims, the present invention may be practiced other than as specifically described in the examples herein.

This application claims priority under 35 USC § 119 to Japanese Patent Application No.2003-337509 filed on Sep. 29, 2003, the entire contents of which are herein incorporated by reference.

The invention claimed is:

1. An audio power amplifier, comprising:
   a differential amplifier circuit configured to serve as an input circuit, said differential amplifier circuit including
      a SG terminal configured to receive a SG voltage, and
      an audio signal input terminal configured to receive an audio signal; and
   a SG voltage generation circuit configured to output the SG voltage, said SG voltage generation circuit including;
      a voltage follower amplifier configured to output a current,
      a reference voltage source configured to supply a reference voltage to the voltage follower amplifier, and
      a current control circuit configured to control the current output from the voltage follower amplifier;
   wherein said SG voltage rises in a prescribed manner to suppress a pop sound during its transition.

2. The audio power amplifier according to claim 1, wherein said SG voltage initially rises gradually, then quickly increases in a vicinity of one-half of the reference voltage, and increases gradually in the vicinity of the reference voltage.

3. The audio power amplifier according to claim 1, wherein said output current decreases when the SG voltage is low, increases as the SG voltage increases, becomes largest when the SG voltage is approximately a half of the reference voltage, and decreases as the SG voltage approaches the reference voltage.

4. The audio power amplifier according to claim 1, wherein said current control circuit includes:
   an output circuit connected to the voltage follower amplifier;
   a maximum current generation circuit configured to generate a maximum current; and
   an equivalent current flowing device configured to cause the voltage follower amplifier to output a current equivalent to the maximum current.

5. The audio power amplifier according to claim 4, wherein said maximum current generation circuit includes:
   a first MOSFET connected to a first current source, through a source of the first MOSFET, and to the output terminal of the SG voltage generation circuit, through a gate of the first MOSFET;
   a second MOSFET mutually connected with the first MOSFET, through their respective sources, and to a first midpoint voltage between zero volts and the reference voltage, through a gate of the second MOSFET;
   a third MOSFET connected to the second current source, through a source of the third MOSFET, and to the output terminal of the SG voltage generation circuit, through a gate of the third MOSFET; and
   a fourth MOSFET mutually connected with the third MOSFET, through their respective sources, and to a second midpoint voltage between the first midpoint voltage and the reference voltage, through a gate of the fourth MOSFET;
   wherein said maximum output current is the sum of at least a first difference between drain currents of the first and second MOSFETs, and a second difference between drain currents of the third and fourth MOSFETs.

6. The audio power amplifier according to claim 4, wherein said maximum current generation circuit includes:
- a sample hold circuit configured to hold a voltage appearing immediately before the SG voltage starts rising;
- a first MOSFET connected to a first current source, through a source of the first MOSFET, and to an output terminal of the SG voltage generation circuit, through a gate of the first MOSFET;
- a second MOSFET mutually connected with the first MOSFET, through their respective sources, and to a midpoint voltage between the SG voltage held in the sample hold circuit and a reference voltage, through its gate;
- a third MOSFET connected to a second current source, through a source of the third MOSFET, and to an output terminal of the SG voltage generation circuit, through gate of the third MOSFET; and
- a fourth MOSFET mutually connected with the third MOSFET, through their respective sources, and to the second midpoint voltage between the first midpoint voltage and the reference voltage;
- wherein said maximum output current is the sum of at least a first difference between drain currents of the first and second MOSFETs, and a second difference between drain currents of the third and fourth MOSFETs.

7. A pop sound reduction circuit including the audio power amplifier as claimed in claim 1, wherein the SG voltage generation circuit is formed from a constant voltage generation circuit configured to convert an input voltage to a prescribed output voltage, said constant voltage generation circuit comprising:
- a voltage output circuit configured to output a constant voltage;
- a maximum current generation circuit configured to generate a prescribed maximum current; and
- an equivalent current flowing device configured to cause the voltage output circuit to output a maximum current equivalent to the prescribed maximum current generated by the maximum current generation circuit.

8. The audio power amplifier according to claim 1, wherein a maximum current flowing from the voltage follower amplifier is controlled in accordance with a SG voltage appearing when it starts rising.

9. The audio power amplifier of claim 1, wherein an output of said voltage follower amplifier is connected to an inverted input terminal of said voltage follower amplifier.

10. The audio power amplifier of claim 9, wherein said voltage follower amplifier comprises an operational amplifier circuit.

11. The audio power amplifier of claim 1, wherein said current control circuit is configured to control the current output from the voltage follower amplifier, to change the current from a first non-zero value to a selected second non-zero value.

12. The audio power amplifier of claim 11, wherein the current output from the voltage follower amplifier is controlled, based on a comparison of said SG voltage output by said SG voltage generation circuit and said reference voltage supplied to said voltage follower amplifier.

13. The audio power amplifier of claim 1, wherein said current control circuit includes a sample hold circuit configured to hold the SG voltage appearing immediately before the SG voltage starts rising.

14. A constant voltage generation circuit configured to convert an input voltage to a prescribed output voltage, said constant voltage generation circuit comprising:
- a voltage output circuit configured to output a constant voltage;
- a maximum current generation circuit configured to generate a prescribed maximum current; and
- an equivalent current flowing device configured to cause the voltage output circuit to output a maximum current equivalent to the prescribed maximum current generated by the maximum current generation circuit,
- wherein said maximum current generation circuit includes:
- a first MOSFET connected to a first current source, through a source of the first MOSFET, and to an output of the constant voltage generation circuit, through a gate of the first MOSFET;
- a second MOSFET mutually connected with the first MOSFET, through their respective sources, and to a first midpoint voltage between zero volts and the prescribed voltage, through a gate of the second MOSFET;
- a third MOSFET connected to a second current source, through a source of the third MOSFET, and to the output of the constant voltage generation circuit, through a gate of the third MOSFET; and
- a fourth MOSFET mutually connected with the third MOSFET, through their respective sources, and to a second midpoint voltage between the first midpoint voltage and the prescribed voltage, through a gate of the fourth MOSFET;
- wherein said maximum output current is the sum of at least a first difference between drain currents of the first and second MOSFETS, and a second difference between drain currents of the third and fourth MOSFETs.

15. A constant voltage generation circuit configured to convert an input voltage to a prescribed output voltage, said constant voltage generation circuit comprising:
- a voltage output circuit configured to output a constant voltage;
- a maximum current generation circuit configured to generate a prescribed maximum current; and
- an equivalent current flowing device configured to cause the voltage output circuit to output a maximum current equivalent to the prescribed maximum current generated by the maximum current generation circuit,
- wherein said maximum current generation circuit includes:
- at least two current sources; and
- a calculation device configured to apply addition and subtraction to an optional combination of currents output from the at least two current sources in accordance with a constant voltage output when the constant voltage starts rising;
- wherein said calculation device sets the addition and subtraction result as the maximum current.

16. An amplifier circuit, comprising:
- a differential amplifier configured to serve as an input circuit and including:
  - a SG terminal configured to receive a SG voltage;
  - an audio signal input terminal configured to receive an audio signal; and
- a SG voltage generation circuit configured to output the SG voltage and including:
  - a voltage follower amplifier configured to output a current,
  - a reference voltage source input to the voltage follower amplifier, and a current control circuit configured to control the current output from the voltage follower amplifier;
wherein said SG voltage rises in a prescribed manner to suppress pop sound during its transition.

17. A pop sound reduction system, comprising:
an amplifier as claimed in any one of claims 1 and 2, wherein said SG voltage gently rises, quickly increases at a mid rising point, and gently increases in the vicinity the reference voltage.

18. A pop sound reduction system, comprising:
an audio power amplifier as claimed in claim 3.

* * * * *